United States Patent
Perin et al.

(10) Patent No.: US 11,218,224 B2
(45) Date of Patent: Jan. 4, 2022

(54) DSP-FREE COHERENT RECEIVER

(71) Applicant: The Board of Trustees of the Leland Stanford Junior University, Stanford, CA (US)

(72) Inventors: Jose Krause Perin, Stanford, CA (US); Joseph M. Kahn, San Carlos, CA (US); Anujit K. Shastri, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/613,283

(22) PCT Filed: May 15, 2018

(86) PCT No.: PCT/US2018/032672
§ 371 (c)(1),
(2) Date: Nov. 13, 2019

(87) PCT Pub. No.: WO2018/213251
PCT Pub. Date: Nov. 22, 2018

(65) Prior Publication Data
US 2020/0195354 A1    Jun. 18, 2020

Related U.S. Application Data

(60) Provisional application No. 62/506,213, filed on May 15, 2017.

(51) Int. Cl.
*H04B 10/06* (2006.01)
*H04B 10/61* (2013.01)
(Continued)

(52) U.S. Cl.
CPC ........ *H04B 10/6151* (2013.01); *H03L 7/097* (2013.01); *H04L 27/0014* (2013.01);
(Continued)

(58) Field of Classification Search
CPC .................................................. H04B 10/6151
See application file for complete search history.

(56) References Cited

U.S. PATENT DOCUMENTS

| 2008/0232816 A1* | 9/2008 | Hoshida | H04J 14/06 398/152 |
| 2010/0196008 A1* | 8/2010 | Szafraniec | H04B 10/697 398/65 |

(Continued)

OTHER PUBLICATIONS

Authorized Officer: Shane Thomas, International Search Report and Written Opinion issued in counterpart PCT application No. PCT/US2018/032672, dated Aug. 3, 2018, 7 pp.
(Continued)

*Primary Examiner* — David C Payne
*Assistant Examiner* — Pranesh K Barua
(74) *Attorney, Agent, or Firm* — Kaplan Breyer Schwarz, LLP

(57) ABSTRACT

Disclosed are systems, methods, and structures for DSP-free coherent receiver architectures applicable for short-reach optical links. Operationally, a received optical signal is down-converted by mixing it with a local oscillator (LO) laser signal using a 90-degree hybrid followed by balanced photodiodes. Other receiver functions are performed using analog signal processing thereby avoiding power-hungry, high-speed analog-to-digital converters and high-speed digital signal processing. Carrier phase recovery is performed by an electrical phase-locked loop employing a multiplier-free phase estimator stage that—while designed for quaternary phase-shift keying signals—may be employed in designs exhibiting higher modulation formats. Since carrier phase
(Continued)

recovery is performed in the electrical domain, LO laser frequency modulation or LO laser integration is not employed. Polarization demultiplexing—if employed—may be performed by the addition of an optical polarization controller prior to the hybrid and may advantageously be realized by cascading multiple phase shifters driven by low-speed circuitry.

14 Claims, 19 Drawing Sheets

(51) Int. Cl.
*H03L 7/097* (2006.01)
*H04L 27/00* (2006.01)
*H04L 27/152* (2006.01)
*H04L 27/227* (2006.01)

(52) U.S. Cl.
CPC .......... *H04L 27/152* (2013.01); *H04L 27/227* (2013.01); *H04L 2027/0069* (2013.01)

(56) References Cited

U.S. PATENT DOCUMENTS

| | | | |
|---|---|---|---|
| 2010/0296819 A1 | 11/2010 | Kahn et al. | |
| 2011/0200339 A1 | 8/2011 | Komaki et al. | |
| 2012/0106982 A1 | 5/2012 | Wagner et al. | |
| 2014/0023368 A1* | 1/2014 | Bhandare | H04J 14/06 398/65 |
| 2015/0063378 A1* | 3/2015 | Nebendahl | H04B 10/614 370/537 |
| 2015/0162991 A1* | 6/2015 | Gupta | H04B 10/61 398/202 |
| 2016/0013868 A1* | 1/2016 | Anderson | G02F 1/015 359/246 |
| 2016/0173109 A1* | 6/2016 | Montoriol | H03L 7/1976 327/156 |
| 2019/0379462 A1* | 12/2019 | Razzell | H04J 14/06 |
| 2020/0007263 A1* | 1/2020 | Cavaliere | H04B 10/67 |

OTHER PUBLICATIONS

Jose Krause Perin et al., "Design of Low-Power DSP-Free Coherent Receivers for Data Center Links", "Journal of Lightwave Technology", Nov. 1, 2017, Publisher: IEEE, DOI: 10.1109/JLT.2017. 2752079, 13 pp., vol. 35, No. 21.

* cited by examiner

DSP-FREE COHERENT RECEIVER

CROSS REFERENCE TO RELATED APPLICATIONS

This application claims the benefit of U.S. Provisional Patent Application Ser. No. 62/506,213 filed 15 May 2017.

TECHNICAL FIELD

This disclosure relates generally to optical communications. More particularly, it pertains to coherent optical receivers that do not employ high-speed analog-to-digital converters (ADCs), or digital signal processors (DSPs).

BACKGROUND

As is known in the art, coherent optical receivers employing high-speed DSPs exhibit high spectral efficiency and receiver sensitivity—particularly in long-haul applications where they have found widespread applicability and adoption. Notwithstanding these benefits, DSP-based coherent receivers have experienced a more limited adoption in data center applications due—in part—to their significant power requirements, higher cost, and the different transmission characteristics of data center and metro optical transmission systems namely; chromatic dispersion and/or polarization mode dispersion is negligible.

SUMMARY

An advance is made in the art according to aspects of the present disclosure directed to coherent optical receivers that do not employ high-speed Analog-to-Digital Converters (ADCs) or Digital Signal Processors (DSPs). In sharp contrast to the prior art, coherent optical receivers according to the present disclosure employ polarization recovery using cascaded phase shifters driven by marker tone detection circuitry and carrier recovery based on either an Optical Phase-Locked-Loop (OPLL) or Electrical Phase-Locked-Loop (EPLL) in conjunction with a multiplier-free phase detector.

To address such fundamental differences our novel approach(es) according to aspects of the present disclosure include low(er)-power architectures based on analog signal processing that advantageously eliminate the high-cost, power-hungry, high-speed ADCs and DSP altogether.

As we shall now show and disclose, we describe and evaluate homodyne DSP-free coherent receiver architectures for DP-QPSK. We disclose further a polarization demultiplexing scheme based on optical phase shifters that are controlled by low-frequency marker tone detection circuitry in which carrier recovery (CR) is based on either an optical or an electrical phase-locked loop (PLL). Additionally, we disclose a multiplier-free phase detector based on exclusive-OR (XOR) gates. We finally disclose and evaluate the relative performance of homodyne DP-differential QPSK (DP-DQPSK), whereby information is encoded in phase transitions, hence avoiding CR circuitry altogether.

As will be readily appreciated by those skilled in the art, systems, methods, apparatus, and architectures according to the present disclosure are particularly well-suited for relatively short-reach optical links exhibiting negligible chromatic dispersion (or compensated optically) and/or polarization dispersion such as those found in contemporary data centers and/or metro links.

This SUMMARY is provided to briefly identify some aspect(s) of the present disclosure that are further described below in the DESCRIPTION. This SUMMARY is not intended to identify key or essential features of the present disclosure nor is it intended to limit the scope of any claims.

The term "aspect" is to be read as "at least one aspect". The aspects described above, and other aspects of the present disclosure are illustrated by way of example(s) and not limited in the accompanying drawing.

BRIEF DESCRIPTION OF THE DRAWING

A more complete understanding of the present disclosure may be realized by reference to the accompanying drawing in which:

FIG. 2(A) and FIG. 2(B) show a schematic block diagram illustrating carrier recovery according to aspects of the present disclosure based on: FIG. 2(A) optical phase-locked loop (OPLL); and FIG. 2(B) electrical phase-locked loop (EPLL—shown for one phase only) wherein phase estimates in the two polarizations may be optionally combined in the adder depicted in dashed lines;

FIG. 3(A) three phase shifting sections; and FIG. 3(B) two phase shifting sections;

FIG. 10(A) FIG. 10(B) are schematic block diagrams of: FIG. 10(A) polarization recovery and, FIG. 10(B) detection of a DQPSK signal wherein detection is shown for only one polarization and is identical in the second—both according to aspects of the present disclosure;

DETAILED DESCRIPTION

Figure 1:
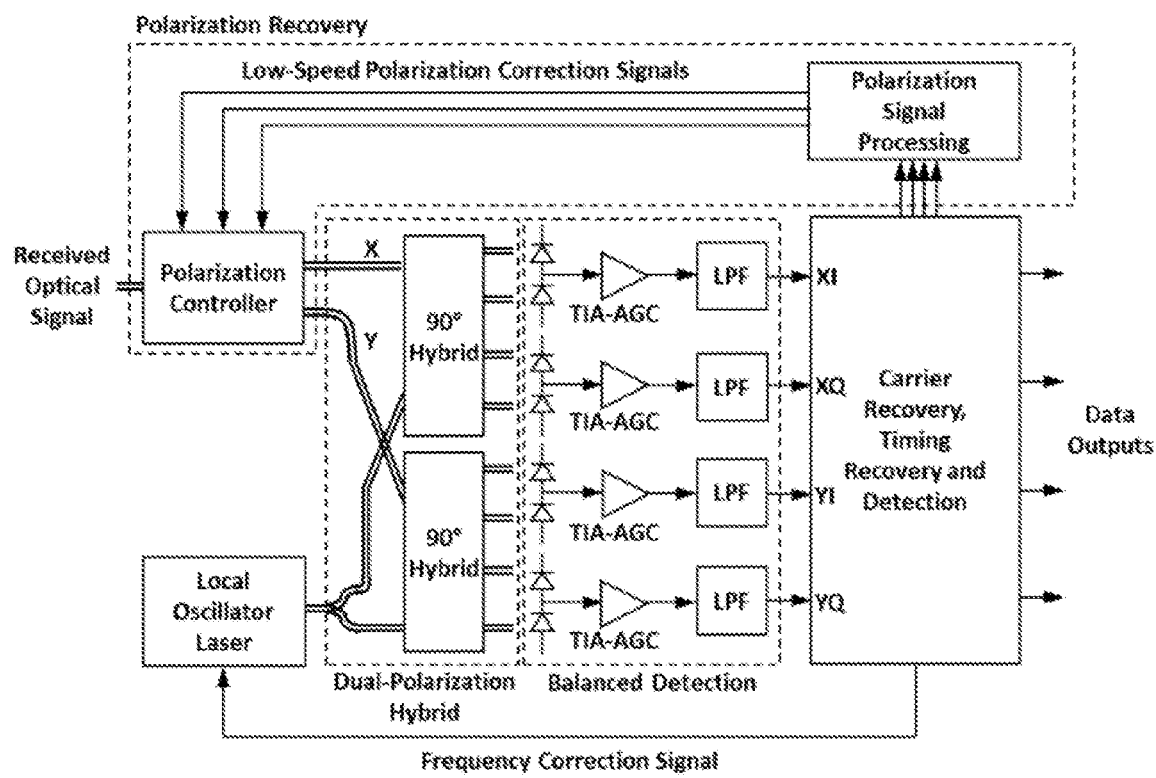
FIG. 1 shows a schematic block diagram depicting an illustrative dual-polarization quadrature phase shift keying (DP-QPSK) receiver employing analog signal processing according to aspects of the present disclosure.

The following merely illustrates the principles of the disclosure. It will thus be appreciated that those skilled in the art will be able to devise various arrangements which, although not explicitly described or shown herein, embody the principles of the disclosure, and are included within its spirit and scope. More particularly, while numerous specific details are set forth, it is understood that embodiments of the disclosure may be practiced without these specific details and in other instances, well-known circuits, structures, and techniques have not been shown in order not to obscure the understanding of the disclosure.

Furthermore, all examples and conditional language recited herein are principally intended expressly to be only for pedagogical purposes to aid the reader in understanding the principles of the disclosure and the concepts contributed by the inventor(s) to furthering the art and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently-known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the disclosure.

In addition, it will be appreciated by those skilled in art that any flow charts, flow diagrams, state transition diagrams, pseudocode, and the like represent various processes which may be substantially represented in computer readable medium and so executed by a computer or processor, whether or not such computer or processor is explicitly shown.

In the claims hereof, any element expressed as a means for performing a specified function is intended to encompass any way of performing that function including, for example, a) a combination of circuit elements which performs that function or b) software in any form, including, therefore, firmware, microcode, or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein. Finally, and unless otherwise explicitly specified herein, the drawings are not drawn to scale.

By way of some additional background we begin by noting that contemporary research on spectrally efficient modulation formats compatible with intensity modulation and direct detection (IM-DD), has led to the adoption of four-level pulse amplitude modulation standardized formats (4-PAM) by the IEEE P802.3bs task force to enable 50 and 100 Gbit/s-per-wavelength data center interconnects. However—and as will be readily appreciated by those skilled in the art—scaling bit rates beyond 100 Gbit/s is challenging, as these IM-DD systems exploit only one degree of freedom of the optical fiber channel namely, optical intensity. Moreover, these systems already face tight implementation constraints. Indeed, 50 Gbit/s 4-PAM links for inter-data center applications, i.e., amplified links near 1550 nm with reach up to ~80 km, require an optical signal-to-noise ratio (OSNR) greater than 29 dB to operate below a 7% forward error correction (FEC) threshold. And while 4-PAM links for intra-data center applications, i.e., unamplified links near 1310 nm with reach up to ~10 km, they still suffer from a limited power margin—which may only be improved by 4.5 dB using avalanche photodiodes or only by 6 dB using semiconductor optical amplifiers.

Accordingly, next generation data center links demand innovative low-power solutions that scale to bit rates beyond 100 Gbit/s while accommodating increased optical losses due to fiber plant characteristics, wavelength demultiplexing, and even optical switches. Recently proposed techniques based on Stokes vector detection and single-sideband discrete-multitone (SSB-DMT)—while spectrally efficient—rely on power-hungry analog-to-digital converters (ADCs) and digital signal processing (DSP) and do not provide a sufficiently high OSNR in inter-data center links or an acceptable power margin in intra-data center links.

As will be known and appreciated by those skilled in the art, coherent detection is an attractive, scalable technology, as it enables four degrees of freedom of a single-mode fiber (SMF), namely two quadratures in two polarizations, and improves sensitivity by up to 20 dB by mixing a weak signal with a strong local oscillator (LO).

We note that coherent detection based on high-speed DSP—while a mature technology as employed long-haul communications systems—is believed by many to be unsuitable for data center links. In long-haul systems, the high cost and significant power consumption of high-speed DSPs are amortized, as a 3-dB sensitivity improvement—for example—may double the reach and nearly halve the number of required repeaters.

Data center applications, however, have other design priorities and characteristics such as low cost, low power consumption, and high port density, while exhibiting fewer propagation impairments—since polarization mode dispersion (PMD) and nonlinearities are negligible. To address such fundamental differences our novel approach(es) according to aspects of the present disclosure include low (er)-power architectures based on analog signal processing that advantageously eliminate the high-cost, power-hungry, high-speed ADCs and DSP altogether.

As we shall show and disclose, we also describe and evaluate homodyne DSP-free coherent receiver architectures for DP-QPSK. We disclosure further a polarization demultiplexing scheme based on optical phase shifters that are controlled by low-frequency marker tone detection circuitry in which carrier recovery (CR) is based on either an optical or an electrical phase-locked loop (PLL). Additionally, we disclose a multiplier-free phase detector based on exclusive-OR (XOR) gates. We finally disclose and evaluate the relative performance of homodyne DP-differential QPSK (DP-DQPSK), whereby information is encoded in phase transitions, hence avoiding CR circuitry altogether.

As will be appreciated by those skilled in the art, the estimated power consumption of the high-speed analog electronics of our most power-hungry architecture is below 2 W for 200 Gbit/s DP-QPSK, assuming 90 nm CMOS. Moreover, at small chromatic dispersion (CD), our DSP-free systems—according to aspects of the present disclosure—exhibit ~1 dB power penalty as compared to their DSP-based counterparts.

As a roadmap to our disclosure, we present illustrative architecture(s) for DP-QPSK receivers based on analog signal processing and describe polarization demultiplexing, CR, and a startup protocol—all according to aspects of the present disclosure. Finally, we disclose a homodyne DP-DQPSK receiver architecture according to aspects of the present disclosure that does not require CR.

Turning now to FIG. 1, there it shows a block diagram of an illustrative DP-QPSK coherent receiver employing analog signal processing according to aspects of the present disclosure. In the illustrative implementation shown, a polarization controller is driven by a low-speed microcontroller, which does marker tone detection, as will be discussed with respect to polarization demultiplexing later in this disclosure.

After received optical signal(s) undergo balanced photodetection, transimpedance amplifiers (TIAs) with automatic gain control (AGC), and low-pass filtering (LPF) to reduce noise, the signals arrive at a high-speed analog electronics stage, where CR, timing recovery and detection are performed. As those skilled in the art will readily appreciate, timing recovery and detection may be realized using conventional clock and data recovery (CDR) techniques; thus, we do not discuss them further herein. The high-speed analog electronics stage is detailed in FIG. 2(A) and FIG. 2(B) for CR based on optical PLL (OPLL) and electrical PLL (EPLL).

Figure 2A:
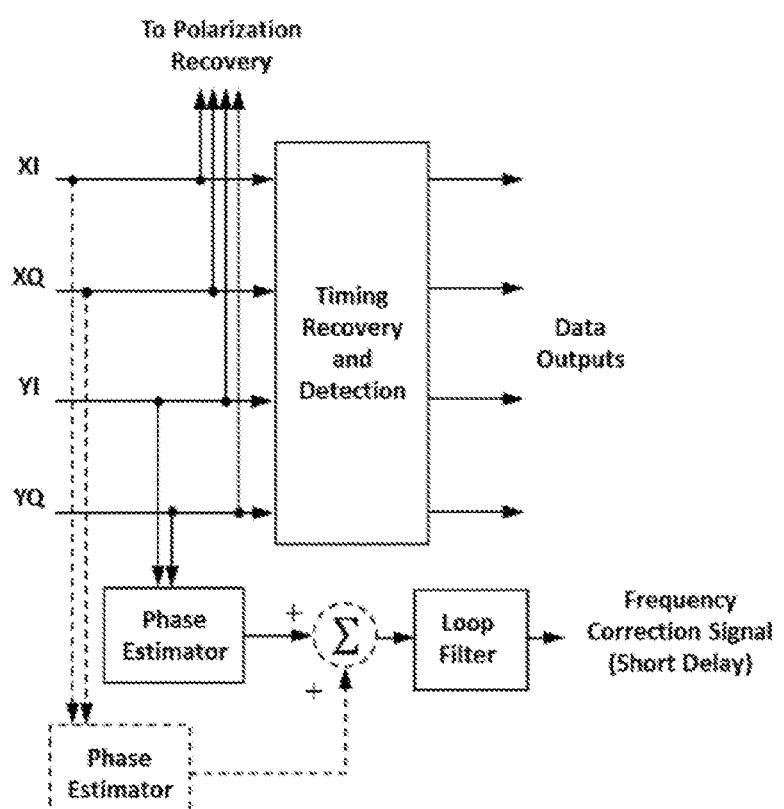
Figure 2B:
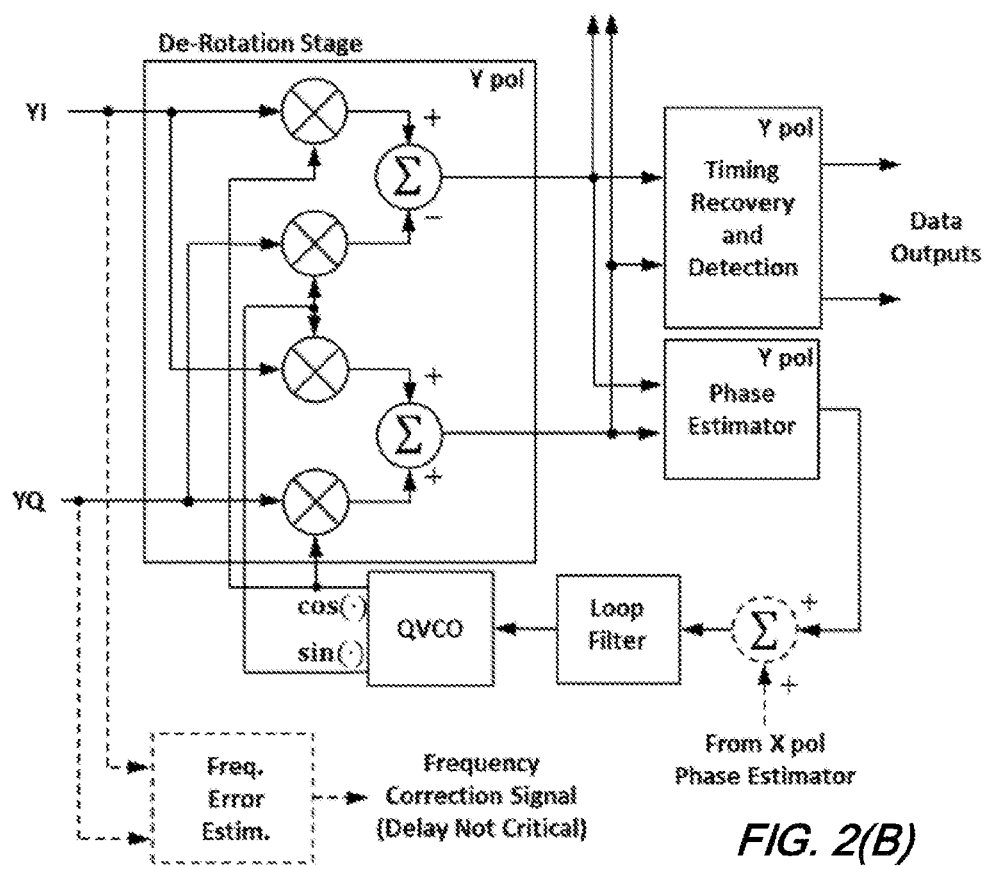

In an OPLL (FIG. 2(A)), the LO laser is frequency-modulated by the frequency correction signal generated by the CR stage. Hence, an OPLL requires a LO laser with wideband frequency modulation (FM) response and short propagation delay in the LO path to minimize the overall loop delay. As will be appreciated, minimizing the loop delay is one of the main challenges in OPLL design, since the loop includes the LO laser, 90° hybrid, photodiodes, and all the subsequent electronics in CR, which may not be realized within the same chip. Notably, Park et al have demonstrated loop delays of only 120 ps for a highly integrated 40 Gbit/s binary PSK (BPSK) coherent receiver.

An EPLL (FIG. (2B)) implementation eliminates requirements on LO laser FM response and on propagation delay at the cost of more complex analog electronics. Specifically, an EPLL requires a single-side band mixer in each polarization to de-rotate the incoming signals (see FIG. 2(B)), since the transmitter and LO lasers are not phase locked. Additionally, the frequency offset between transmitter and LO lasers must always be within the lock-in and hold-in ranges of the EPLL, which are typically limited by the voltage-controlled oscillator (VCO) frequency range. This constraint can be satisfied by strict laser temperature control, whose cost and power consumption could be shared among several channels by using frequency combs for both the transmitter and LO. Alternatively, a frequency error estimation stage (FIG. 2(B)), based on relatively simple frequency discriminator circuitry, may be used to keep the LO laser frequency sufficiently close to the transmitter laser.

At this point, we restrict our analysis to the feedback CR techniques OPLL and EPLL, which are governed by the same underlying theory. Feedforward CR (FFCR) has been widely used in DSP-based coherent receivers, and it is also feasible in analog signal processing. Note however, that analog FFCR has several implementation drawbacks.

First, phase estimation in analog FFCR is limited to non-data-aided (NDA) methods, e.g., raising the signal to Mth power (for M-PSK), which have poorer performance than decision-directed methods and restrict modulation to PSK. Second, compared to feedback techniques, FFCR requires more complex analog circuitry to implement an Mth-power operation and frequency division. Furthermore, analog FFCR would offer virtually no improvement over EPLL, since commercial distributed feedback (DFB) lasers exhibit narrow linewidths on the order of 300 kHz, and loop delay in an EPLL is very small—as the loop can be realized within a single chip.

Polarization Demultiplexing

In DSP-based coherent receivers, a 2×2 MIMO equalizer performs polarization demultiplexing and compensates for PMD and polarization-dependent loss (PDL). Fortunately, PMD effects are negligible up to 80 km at 56 Gbaud with modern standard single mode fiber (SMF). With PDL causing only small power penalties at these distances, polarization rotation becomes the only impairment that needs to be compensated. Advantageously, polarization rotation through a fiber is a slow, time-varying effect on the order of milliseconds, which can be compensated at the receiver by an optical polarization controller driven by low-speed (<100 kHz) circuitry.

Polarization demultiplexing using optical polarization control has been implemented using fiber squeezers or interferometers with variable phase shifters. Both of these implemented solutions employ the same underlying principle of cascading birefringent elements to transform the incoming state of polarization. The latter allows for integration and is the method chosen for our analog coherent receiver according to aspects of the present disclosure. FIG. 1 shows an illustrative polarization controller which is detailed illustratively in FIG. 3(A).

Figure 3A:
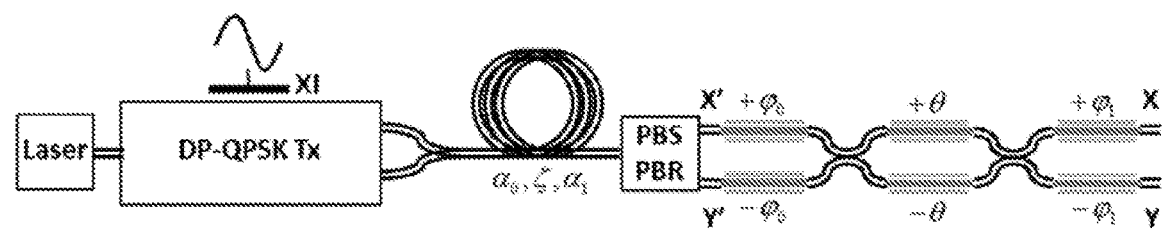
FIG. 3(A) and FIG. 3(B) show a schematic block diagram of polarization controller recovery methods according to aspects of the present disclosure employing.

With reference now to that FIG. 3(A), it may be observed that a polarization beam splitter (PBS) and polarization beam rotator (PBR) first separate the two incoming, rotated polarizations and rotate one, such that both are aligned to integrated waveguides supporting a single polarization.

Once the incoming signal's rotated polarizations have been separated into two waveguides, they are cascaded through three phase shifters and two 50/50 couplers. By controlling the relative phase shift through each phase shifter, the polarizations are demultiplexed into the signals transmitted on the X and Y polarizations at the two output ports of the polarization controller, at which point they are guided to the 90° hybrid.

Figure 3B:
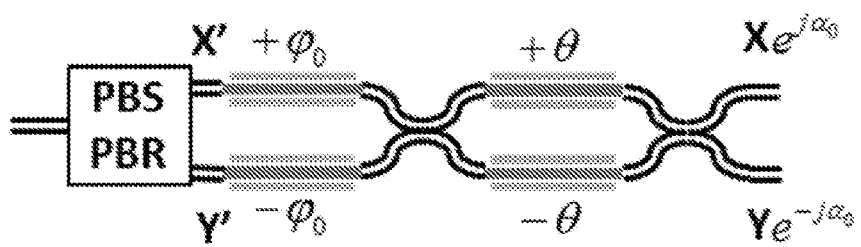

Polarization demultiplexing based on minimization of the radio frequency (RF) power spectral density (PSD), as previously proposed for DP-DQPSK requires independent CR in each polarization, which is not feasible for OPLL-based receivers, and adds significant complexity to EPLL-based receivers. Our method and algorithm according to aspects of the present disclosure is based on marker tone detection and can be used for QPSK, higher-order quadrature amplitude modulation (QAM), and intensity-modulated (IM) signals. As illustrated in FIG. 3(A) and FIG. 3(B), the DP-QPSK transmitter has a low-frequency (<50 kHz)

marker tone added to the XI tributary. The phase shifters are adjusted to minimize the marker tone's presence in the XQ, YI, and YQ tributaries at the receiver, so that the polarization rotation through the fiber is compensated completely.

To show how the phase shifters are adjusted to demultiplex the incoming, rotated polarizations, we begin with the arbitrary, unitary matrix for polarization transformation due to fiber propagation in the absence of PDL and PMD, written as:

$$T_{Fiber} = \begin{bmatrix} e^{j\alpha_1} & 0 \\ 0 & e^{-j\alpha_1} \end{bmatrix} \begin{bmatrix} \cos(\zeta) & -j\sin(\zeta) \\ -j\sin(\zeta) & \cos(\zeta) \end{bmatrix} \begin{bmatrix} e^{j\alpha_0} & 0 \\ 0 & e^{-j\alpha_0} \end{bmatrix} \quad [1]$$

where the variables $\alpha_1$, $\zeta$, and $\alpha_1$ represent random, time-varying rotation variables of the unitary matrix corresponding to the rotation undergone by propagation through the fiber, as shown in FIG. 3. Unless otherwise specified, throughout this disclosure we omit (t) from time-varying variables to simplify notation. To compensate for this rotation, a similar matrix can be obtained by setting up a sequence of three phase shifters separated by two couplers, as shown in FIG. 3. The matrix corresponding to this sequence is $$T_{Controller} = \begin{bmatrix} e^{j\varphi_1} & 0 \\ 0 & e^{-j\varphi_1} \end{bmatrix} \begin{bmatrix} \cos(\zeta) & -j\sin(\zeta) \\ -j\sin(\zeta) & \cos(\zeta) \end{bmatrix} \begin{bmatrix} e^{j\varphi_0} & 0 \\ 0 & e^{-j\varphi_0} \end{bmatrix} \quad [2]$$

where the variables $\varphi_1$, $\theta$, and $\varphi_0$ correspond to the amount of differential phase shift in each of the three phase shifters, as shown in FIG. 3. Setting up mirror matrices for propagation and the controller enables easier analysis. The output electric field values after the polarization controller are $$\begin{bmatrix} E_{o,x} \\ E_{o,y} \end{bmatrix} = T_{Controller} T_{Fiber} \begin{bmatrix} E_{i,x} \\ E_{i,y} \end{bmatrix} \quad [3]$$

where $E_{o,x}$ and $E_{i,y}$ are the output electric fields in the X and Y polarizations and $E_{i,x}$ and $E_{i,y}$ are the input electric fields in the X and Y polarizations. When the polarization controller is close to compensating the fiber-induced polarization rotation, the following approximations hold:

$\varphi_0 \approx -\alpha_1$ $\varphi_1 \approx -\alpha_0$ $\theta \approx -\zeta$ [4]

Equality holds when the polarization rotation has been perfectly compensated. Using [3] small-angle approximations that follow from [4], we can compute the dependence of the input electric field that carries the marker tone on the output electric fields:

$\text{Im}\{E_{o,x}\} = [(\varphi_1+\alpha_0)+\cos(2\theta)(\varphi_0+\alpha_1)]\text{Re}\{E_{i,x}\}$ $\text{Re}\{E_{o,y}\} = [-(\theta+\zeta)\sin(2\varphi_1)-\sin(2\theta)(\varphi_0+\alpha_1)]\text{Re}\{E_{i,x}\}$ $\text{Im}\{E_{o,y}\} = [-(\theta+\zeta)\cos(2\varphi_1)]\text{Re}\{E_{i,x}\}$ [5]

where $\text{Re}\{\bullet\}$ and $\text{Im}\{\bullet\}$ denote the real and imaginary part, respectively. By convention, the marker tone is in $\text{Re}\{E_{i,x}\}$. Note that we omit the other electric field input terms that do not carry the marker tone. Hence, the equations in [5] go to zero when the polarization rotation has been perfectly compensated.

In practice, the output electric fields used in [4] are represented by the downconverted signals XQ, YI, and YQ shown in FIG. 2. By low- or band-pass filtering and synchronously detecting them, the amplitude and sign of the marker tone in XQ, YI, and YQ can be estimated, enabling low-speed signal processing to adjust the controller phase shifts $\varphi_1$, $\theta$, and $\varphi_0$ to minimize the unwanted marker tone amplitude, thus compensating for fiber polarization rotation. Appendix I herein shows that minimizing the unwanted marker tone amplitude results in polarization demultiplexing with 180° phase ambiguity i.e., $T_{Controller} T_{Fiber} = \pm I$, where I is the identity matrix. This 180° phase ambiguity is not critical, however, since the receiver already has to resolve a 90° phase ambiguity introduced by CR. As discussed herein with respect to carrier recovery, the phase ambiguity is typically resolved by transmitting a training sequence or by differentially decoding the bits.

Figure 4:
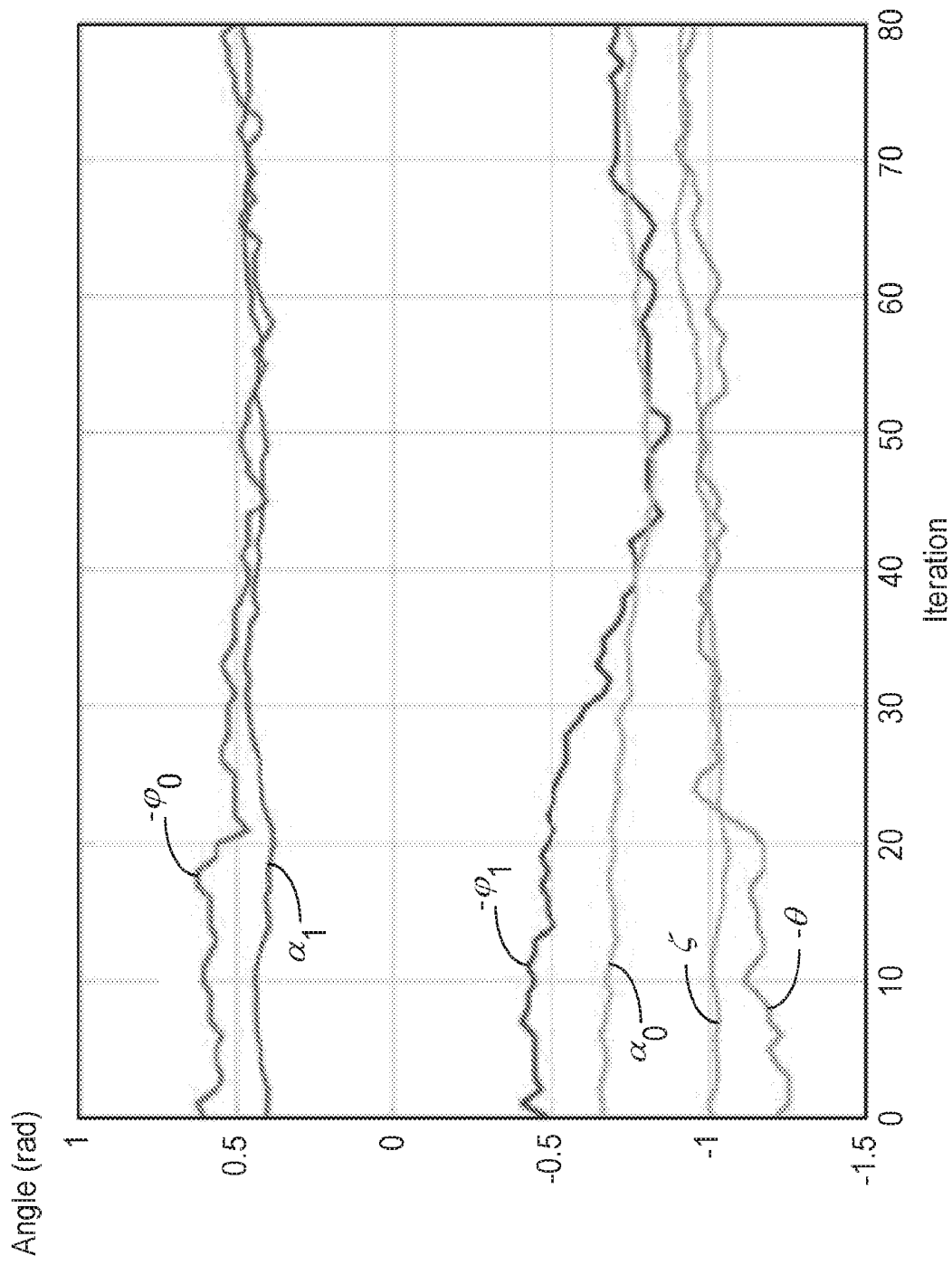
FIG. 4 is a plot showing convergence of the phase shifter variables $\varphi_0$, $\varphi_1$ and $\theta$ to the fiber propagation matrix phases $\alpha_1$, $\alpha_0$ and $\zeta$ which indicates that the system locks to a demultiplexed state according to aspects of the present disclosure.

Through simulation, we have verified several different methods for adjusting these phase shifts. FIG. 4 illustrates one illustrative method. In this process, a form of cyclic coordinate descent, each phase shift is increased and decreased by a fixed increment, and changes minimizing the marker tone amplitude are kept. Using this method, the phase shifts reliably converge to the corresponding fiber matrix variables, as shown in [4].

Figure 5A:
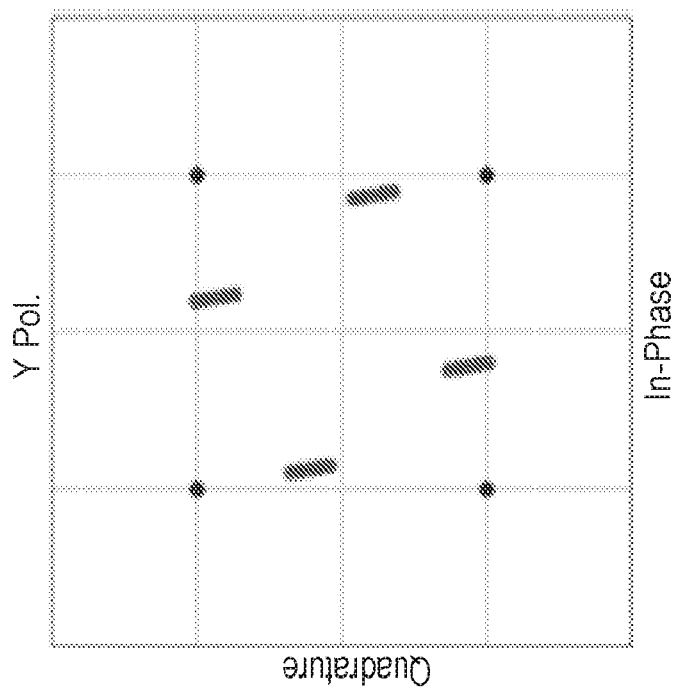
FIG. 5(A) and FIG. 5(B) are constellation plots showing that transmitting the same data in both X and Y polarizations results in QPSK constellations even if the rotation through fiber is not all compensated as in FIG. 2(A) and when the first two phase shifters converge, as in FIG. 2(B) the Y polarization is recovered but there is residual phase offset shown as a rotation of the X polarization constellation, according to aspects of the present disclosure.
Figure 5A:
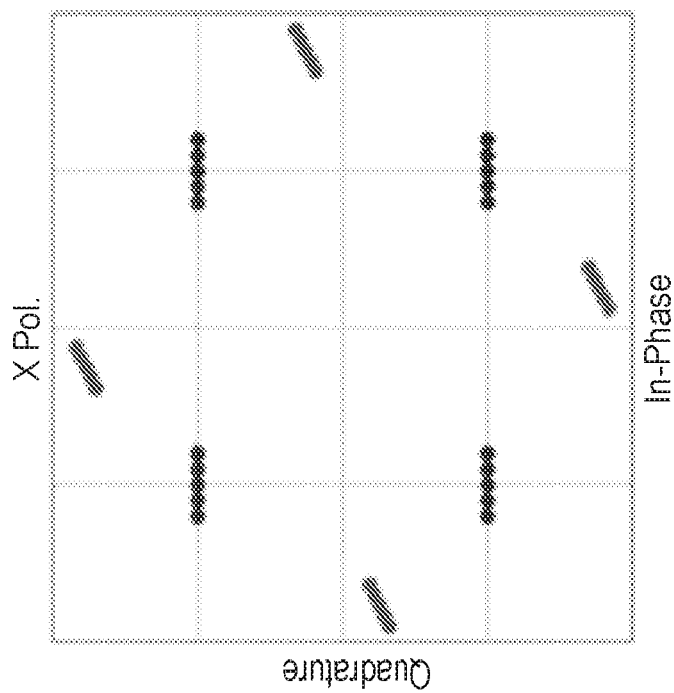

When the small-angle approximations that follow from [4] do not hold, such as during startup, a different procedure must be used before adaptation using [4] can begin. First, the same data should be transmitted on both polarizations, resulting in QPSK constellations at the receiver regardless of polarization rotation through the fiber and allowing for CR phase estimation, as discussed herein with respect to startup protocol. This will produce the constellations shown in FIG. 5(A).

Figure 5B:
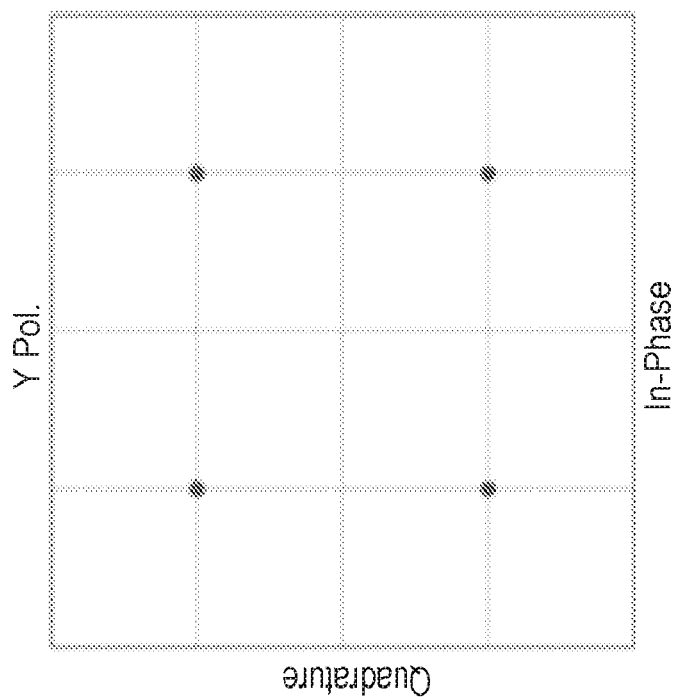
Figure 5B:
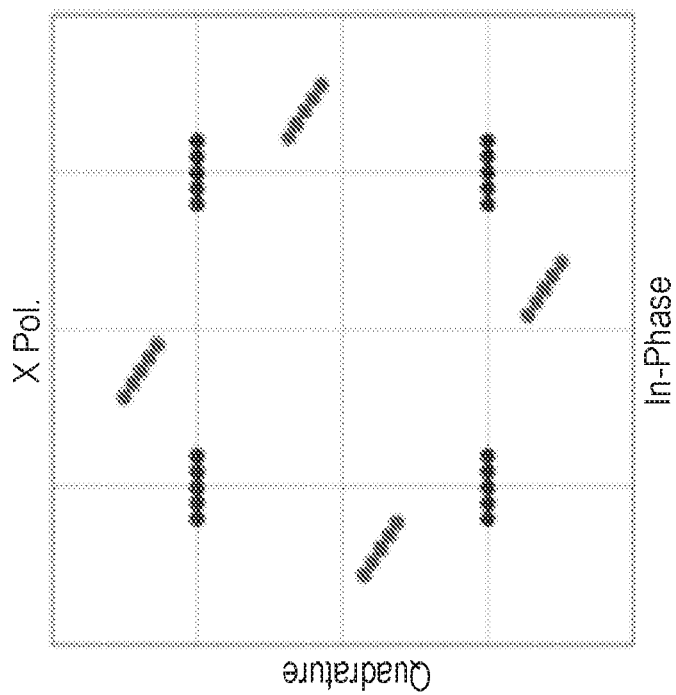

For the transmitted signals, the line extends only in the direction of the real or in-phase portion of the X polarization, but for the received signals, it is clearly in all four tributaries. Next, only variables $\theta$ and $\varphi_0$ should be adjusted to minimize the marker tone only in the Y polarization. By allowing $\varphi_1$ to be free, it only results in a residual phase offset between the X and Y polarizations, as shown by FIG. 5(B). At this point, the marker tone ideally only exists in the X polarization, and [4] can once again be used for adaptation.

The above assumes that phase estimation in the CR stage uses only the Y polarization, as shown in FIG. 5(B) by the Y polarization constellation's absolute phase rotation being zero. This is an important detail when CR phase estimation is performed using only one polarization, as discussed herein with respect to carrier recovery. If the transmitted marker tone is on the same polarization used for CR phase estimation, there will be a residual phase offset between the two polarizations that cannot be compensated using marker tone detection and the error probability in the orthogonal polarization could become as high as 0.5. This is because the marker tone is reduced to the X polarization, and the polarization controller's logic will have no knowledge of the relative rotation between the constellations in the X and Y polarizations. When the transmitted marker tone is in the X polarization and CR phase estimation is done using only the Y polarization, the residual phase offset between the two polarizations can be identified by the polarization controller as marker tone present in the imaginary or quadrature part of the X polarization, as shown in FIG. 5(B).

The number of phase shifters in the polarization controller determines the receiver optics complexity. For a previously proposed method for DP-DQPSK, the minimum number of phase shifters is shown to be two, since the two polarizations are recovered and detected separately. Our illustrative method herein requires three phase shifters if the two polarization branches share the same CR stage. This is the case in an OPLL (FIG. 2(A)), since the LO laser is shared by both polarizations. It is also the case for EPLL implementations sharing CR between polarization branches, regardless of whether one or two polarizations are used for phase estimation (FIG. 2(B)). If, however, CR is performed separately for each polarization branch, then only two phase shifters are required. This is shown in FIG. 3(B). Using two phase shifters results in residual phase offsets, denoted by $Xe_0^{j\alpha}$ and $Ye_0^{-j\alpha}$, at the outputs of the polarization controller, but these time-varying, residual phase shifts are compensated later by CR.

Advantageously, underlying materials for the polarization controller can be well-known, for example silica, lithium niobate, or another low-loss material that allows integration of multiple phase-shifting sections. The waveguides do not necessarily need to support multiple polarizations, since the input polarizations are demultiplexed solely by coupling and phase shifts.

Endless polarization control advantageously may be achieved by cascading more phase shifting sections, so that phase shifters can alternate and provide endless phase excursion, despite their individual phase excursion limits. Alternatively, endless polarization control can be achieved by resetting the phase shifters when one of them is close to its excursion limits. Resetting will cause burst errors during the switching period. For phase shifting speeds on the order of 1 ns for $\pi$ phase shifts, typical of phase shifters used for high-speed data modulation, the burst errors can be corrected by 7% FEC with current interleaving standards at 56 Gbaud. With phase shifting speeds on the order of 1 µs for $\pi$ phase shifts, typical of phase shifters tuned thermally, additional buffering of ~200 kbits would be required at 56 Gbaud, increasing latency on the order of the shifting time.

Carrier Recovery

CR architectures based on an OPLL or an EPLL generally include at least three basic stages: phase estimator, loop filter, and oscillator. The oscillator is the LO laser in an OPLL, and an electronic VCO in an EPLL. The phase estimator stage wipes off the modulated data to estimate the phase error, which is then filtered by the loop filter, producing a control signal for the oscillator frequency.

We consider a second-order loop filter described by $$F(s)=2\zeta\omega_n+\omega_n^2/s, \quad [6]$$

where $\zeta$ is the damping coefficient, typically chosen to be $1/\sqrt{2}$ as a compromise between fast response and small overshoot. Here $\omega_n=2\pi f_n$ is the loop natural frequency, which must be optimized to minimize the phase error variance.

Figure 6A:
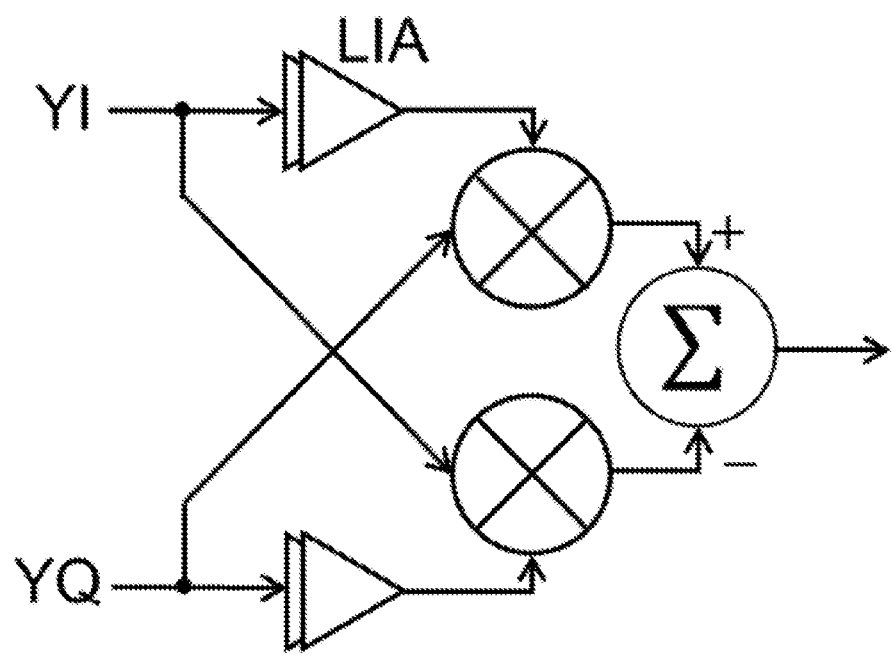
FIG. 6(A) and FIG. 6(B) show carrier phase recovery schematic block diagrams using FIG. 6(A) Costas loop and FIG. 6(B) a multiplier-free approach based on XORs according to aspects of the present disclosure wherein LIA denotes a limiting amplifier and ABS denotes a full-wave rectifier according to aspects of the present disclosure.
Figure 6B:
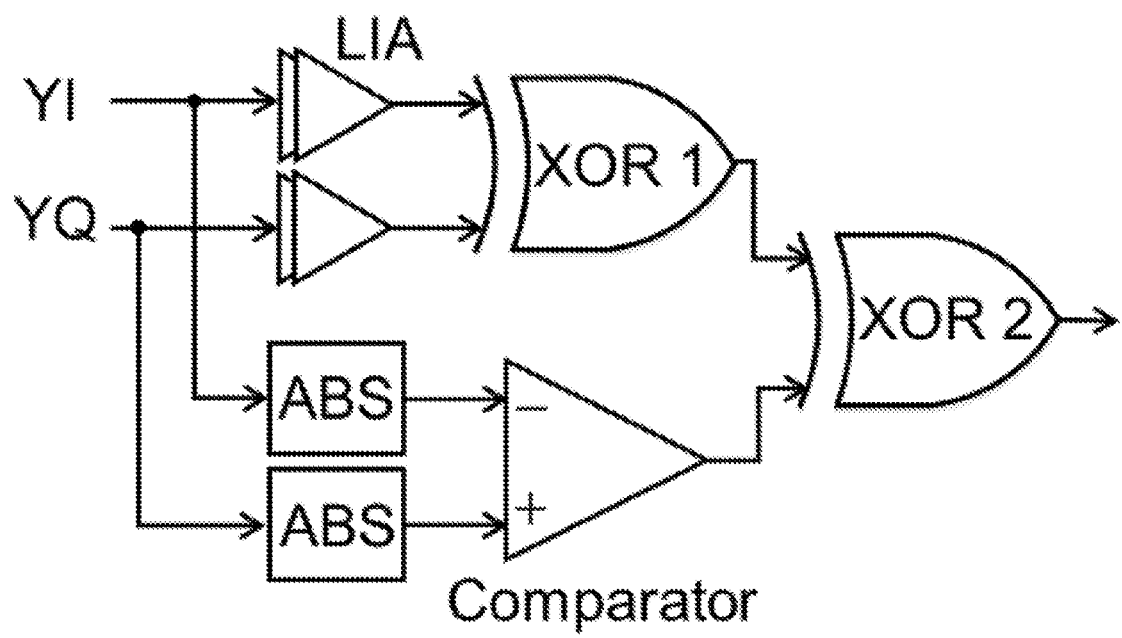

FIG. 6(A) and FIG. 6(B) show two possible implementations of a phase estimator for QPSK inputs. FIG. 6(A) shows the block diagram of a conventional Costas loop, which requires two linear and wideband analog multipliers per polarization. We show a novel multiplier-free phase detector based on XOR gates, as illustratively shown schematically in FIG. 6(B).

Multiplier-free Costas loop alternatives based on XOR gates have been proposed for BPSK and for QPSK. The latter relies on precisely delaying and adding the in-phase and quadrature components prior to the XOR operation. Using simple operations, our proposed phase detector estimates the sign of the phase error rather than its actual value. When XI and XQ form a QPSK signal, the output of the second XOR $o_{XOR2}$ reduces to the sign of phase error: $o_{XOR2}=\text{sgn}(\phi_e)$. After loop filtering and negative feedback, this output counteracts the phase error. When the loop has made the phase error small, $o_{XOR2}$ oscillates very fast, but these fast oscillations are virtually eliminated after low-pass filtering by the loop filter.

Figure 7:
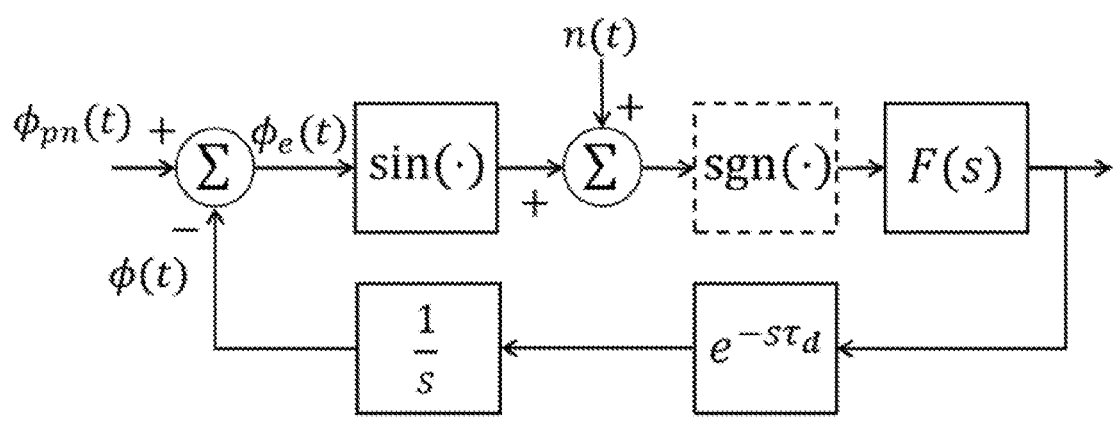
FIG. 7 shows a schematic block diagram of an equivalent Costas loop, without sign operation sgn ( ) and XOR-based loop including sgn ( ) according to aspects of the present disclosure.

FIG. 7 shows an equivalent block diagram of Costas and XOR-based loops of FIG. 6. As may be appreciated, they differ in the nonlinear characteristic within the loop. While the Costas loop nonlinear function is simply $\sin \phi_e(t)$, for the XOR-based loop it is $\text{sgn}(\sin \phi_e(t))$. The delay $\tau_d$ accounts for lumped and distributed delays of components and signal paths in the EPLL or OPLL.

We use the small-signal approximation $\sin \varepsilon \approx \varepsilon$ to linearize the loop transfer function in FIG. 7 and obtain the phase error variance:

$$\sigma_e^2 = \Delta v_{tot} \int_{-\infty}^{\infty} |j\omega + e^{-j\omega\tau_d}F(j\omega)|^{-2} d\omega + \quad [7]$$

$$2(2\pi)^2 k_a \int_0^{\infty} |\omega|^{-1}|j\omega + e^{-j\omega\tau_d}F(j\omega)|^{-2} d\omega +$$

$$\frac{T_s}{2N_{PE}\gamma_s} \frac{1}{2\pi} \int_{-\infty}^{\infty} \left|\frac{F(j\omega)}{j\omega + e^{-j\omega\tau_d}F(j\omega)}\right|^2 d\omega,$$

where $\Delta v_{tot}$ denotes the sum of the transmitter laser and LO laser linewidths, $k_a$ characterizes the magnitude of flicker noise, $T_s$ is the symbol time, and $\gamma_s$ is the signal-to-noise ratio (SNR). $N_{PE}=1$, if phase estimation is performed using only one polarization, and $N_{PE}=2$, if phase estimation is performed in both polarizations and summed, as illustrated in FIG. 2. The terms in [7] account for phase error contribution due to the intrinsic laser phase noise caused by spontaneous emission, flicker noise and additive white Gaussian noise (AWGN), respectively. The loop filter—and in particular $f_n$—should be optimized to minimize [7].

It is important to highlight that $\Delta v_{tot}$ refers to the intrinsic laser linewidth due to spontaneous emission. Low-frequency flicker noise caused by electrical noise in the tuning sections of tunable lasers may lead to an apparent broader linewidth. Indeed, a typical sampled grating (SG) distributed Bragg reflector (DBR) laser with linewidth below 1 MHz had an apparent linewidth ranging from 10 to 50 MHz. However, as indicated in [7], the flicker noise component on the phase error variance is smaller than intrinsic phase noise component, since the flicker noise term integral decays with an additional $|\omega^{-1}|$ factor. Not considering this effect would lead to a suboptimal choice of $f_n$.

Note that the SNR depends on whether the receiver is shot-noise limited, e.g., in unamplified intra-data center links, or ASE-limited, e.g., in amplified inter-data center links:

$$\gamma_s = \begin{cases} \dfrac{RP_{rx}}{2qR_s}, & \text{shot-noise limited} \\ \dfrac{RP_{rx}}{N_A n_{sp} h\nu R_s}, & \text{ASE-limited} \end{cases} \quad [8]$$

where $P_{rx}$ is the received power, R is the photodiodes responsivity, q is the electron charge, h is Planck's constant, $\upsilon$ is the optical signal frequency, $N_A$ is the number of amplifiers, and $R_s$ is the symbol rate. Note that a 1-dB penalty in SNR corresponds to a 1-dB penalty in the receiver sensitivity.

As is known, the bit error probability of a PSK signal with phase error distributed according to $N(0,\sigma_e^2)$ is $$P_b = \frac{1}{2}\mathrm{erfc}(\sqrt{\gamma_s}) + \sum_{l=0}^{\infty}(-1)^l H_l\left(1 - \cos\left((2l+1)\frac{\pi}{4}\right)e^{-\frac{(2l+1)^2\sigma_e^2}{2}}\right), \quad [9]$$

where $\sigma_e^2$ is given in [9] and $$H_l = \frac{\sqrt{\gamma_s}}{\sqrt{\pi}}\frac{e^{-\gamma_s/2}}{(2l+1)}\left(I_l\left(\frac{\gamma_s}{2}\right) + I_{l+1}\left(\frac{\gamma_s}{2}\right)\right) \geq 0 \quad [10]$$

where $I_l(x)$ is the modified Bessel function of the first kind.

Figure 8:
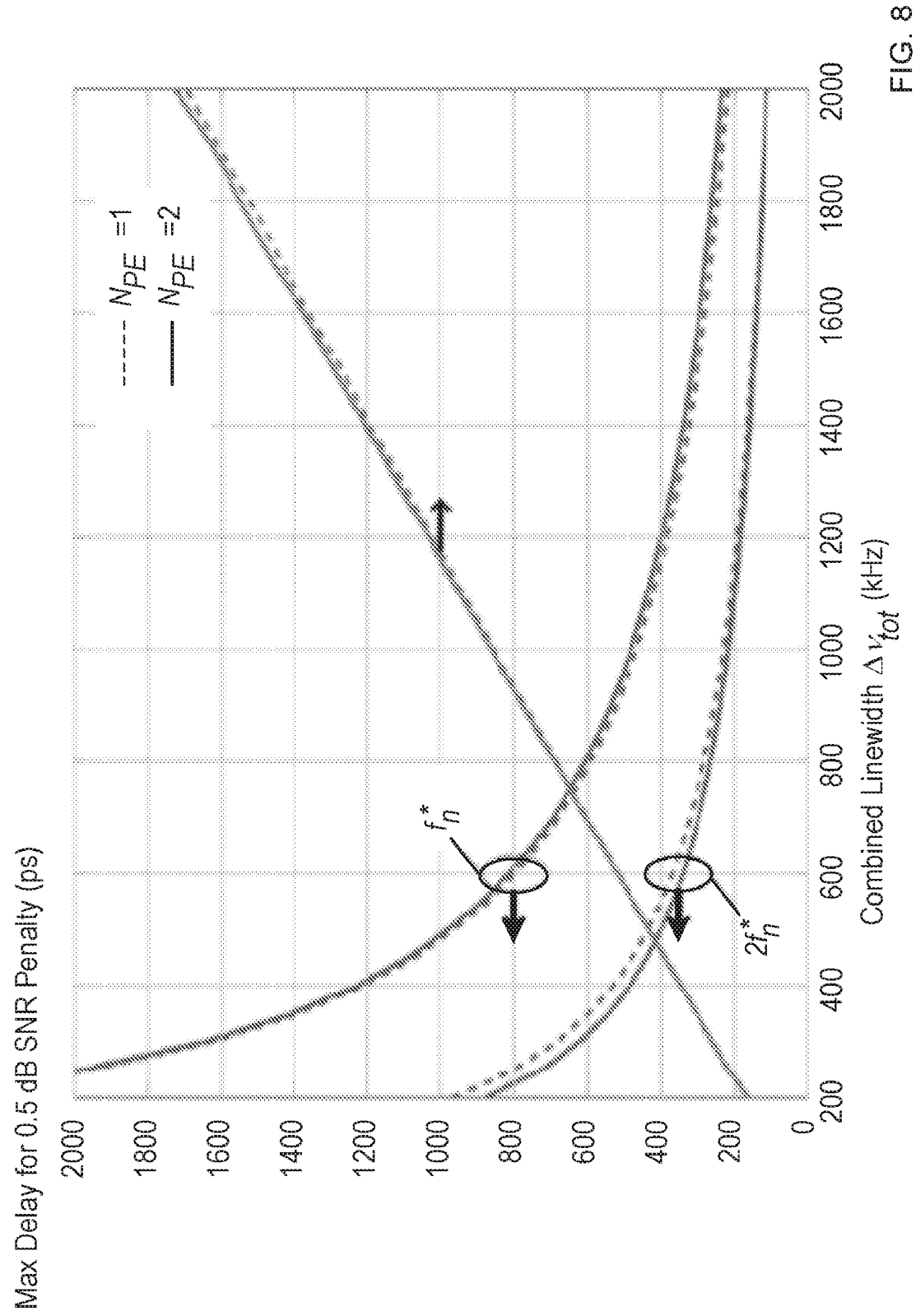
FIG. 8 is a plot showing a maximum loop delay for 0.5-dB signal-to-noise (SNR) penalty as a function of combined linewidth wherein curves are shown for loop filter natural frequency optimized at every point, and when loop filter natural frequency is twice the optimal according to aspects of the present disclosure.

Using equations [7]-[9], we can compute the receiver sensitivity penalty as a function of $f_n$, $\tau_d$, and $\Delta\upsilon_{tot}$. FIG. 8 shows the maximum delay for a 0.5-dB SNR penalty as a function of the combined linewidth for $N_{PE}$=1,2 with respect to a system with no phase noise. The loop natural frequency is optimized at each point. The maximum delay is significantly reduced at wider linewidths or when the natural frequency is suboptimal.

An example of this is shown in FIG. 8 by the curve where the natural frequency is twice the optimal. Interestingly, there is virtually no penalty for using only one of the polarizations for phase estimation in CR, as the optimal value of $f_n$ is reached when the phase noise component in [7] is dominant. FIG. 8 assumes $k_a$=1.7·10$^{10}$ Hz$^2$, which is typical of DFB lasers, but for $k_a$=3.4·10$^{11}$ Hz$^2$, observed in digital supermode DBR (DS-DBR) lasers, the flicker noise effects become significant for $\Delta\upsilon_{tot}$<1 MHz.

Although [7] was derived using the small-signal approximation for the Costas loop $\sin\varepsilon\approx\varepsilon$, the performance of the XOR-based loop is similar to the Costas loop for the same loop filter parameters optimized using [7]-[9].

Figure 9:
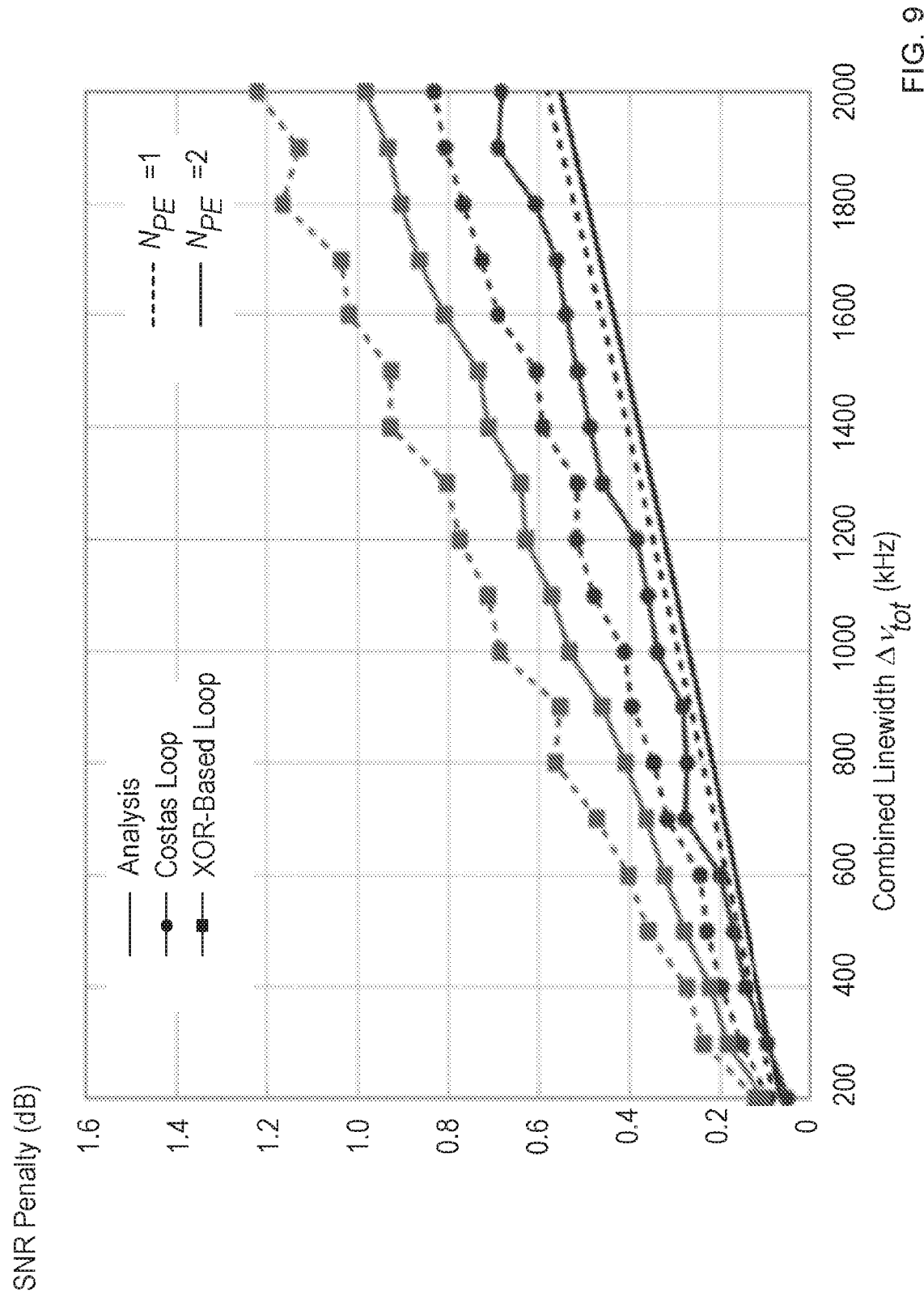
FIG. 9 is a plot showing comparison of SNR penalty vs combined linewidth for Costas loop and XOR-based loop wherein simulation curves include thermal noise and inter-symbol interference (ISI) penalties, while theory curves do not, according to aspects of the present disclosure.

FIG. 9 is a plot showing comparison of SNR penalty vs combined linewidth for Costas loop and XOR-based loop wherein simulation curves include thermal noise and inter-symbol interference (ISI) penalties, while theory curves do not, according to aspects of the present disclosure. As may be observed, FIG. 9 compares the performance of Costas and XOR-based loops as a function of $\Delta\upsilon_{tot}$. They differ by less than 0.5 dB for $N_{PE}$=1,2.

Both Costas and XOR-based phase estimators exhibit a 90° phase ambiguity. This ambiguity is typically resolved by either transmitting a known training sequence at the beginning of transmission, or by differentially decoding the bits. Although differentially decoding the bits doubles the bit-error ratio (BER), near the FEC threshold this corresponds to less than 0.5 dB SNR penalty. Moreover, using a training sequence would require retraining whenever there is a cycle slip. If the bits are differentially decoded, however, a cycle slip only causes a few more error events that could be corrected by the FEC.

Startup Protocol

At startup, the receiver cannot perform polarization demultiplexing and CR simultaneously. For instance, marker tone detection is only possible after CR, so that the marker tone is at the expected frequency. CR, in turn, requires that the received signals in each polarization branch must be QPSK, which is not the case for any given received state of polarization. To circumvent these problems, we have devised a startup protocol.

First, the transmitter sends the same data in both polarizations so that the received signal in each polarization branch is QPSK regardless of the received state of polarization. The transmitted sequence needs to be known at the receiver only if the bits are not differentially decoded, in which case a training sequence is required to resolve the 90° phase ambiguity. Once phase lock is acquired, the polarization estimation algorithm can adjust the phase shifters to demultiplex the two polarizations, as described previously, with the marker tone now at the appropriate frequency. Once the polarizations have been demultiplexed, data transmission in both polarizations can start.

Homodyne DP-DQPSK Receiver

In DQPSK transmission, information is encoded in phase transitions between two consecutive symbols. Hence, DQPSK detection does not require an absolute phase reference and CR is not necessary, which significantly simplifies the receiver.

Homodyne DQPSK, however, has some disadvantages as compared to homodyne QPSK. First, DQPSK has an inherent ~2.4 dB SNR penalty due to differential detection as compared to coherent detection. Second, differential detection restricts modulation to PSK, which limits its spectral efficiency as compared to quadrature-amplitude modulation (QAM).

Compared to the overall block diagram of DP-QPSK receiver shown in FIG. 1, an illustrative DP-DQPSK receiver according to aspects of the present disclosure differs in polarization recovery and in the high-speed analog electronics.

Figure 10A:
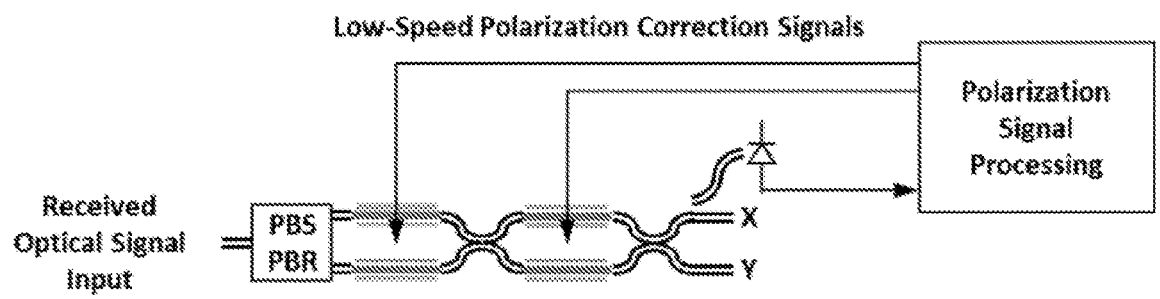

Polarization recovery according to aspects of the present disclosure for DP-DQPSK is illustratively shown in FIG. 10(A). As discussed previously, since detection is separate for the X and Y polarizations, only two (2) phase shifters are needed. Note that a small portion of the optical signal is split off and detected. By changing the phase shifts of the two regions until the RF PSD of this signal is minimized, the incoming, rotated polarizations will be demultiplexed.

Figure 10B:
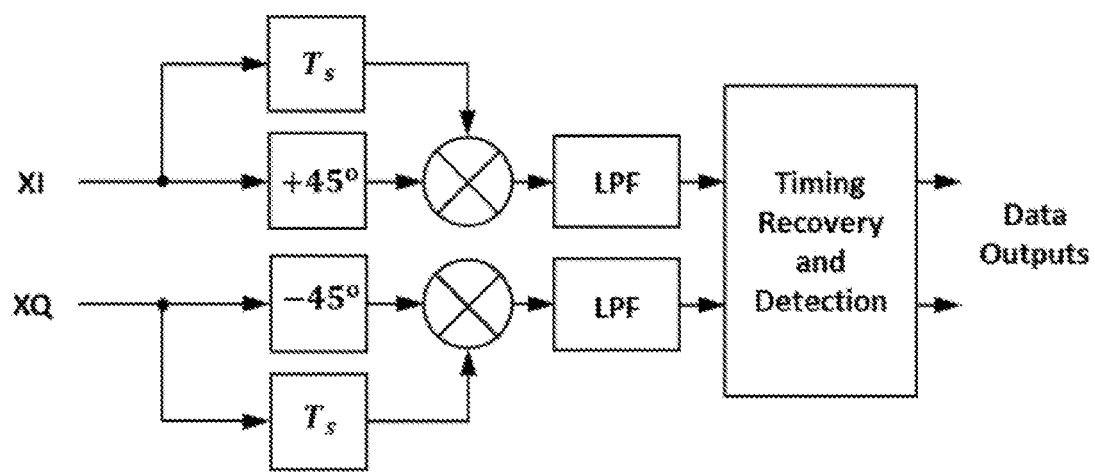

The illustrative high-speed analog operations according to aspects of the present disclosure are shown in FIG. 10(B), which shows a schematic block diagram of differential decoding for one polarization. These two analog multiplications, phase shifts, time delays, and low-pass filtering are the only operations performed in the high-speed analog signal processing of the receiver.

For inter-data center applications using inline optical amplification, where receiver sensitivity is not as critical due to optical amplification, DQPSK may be implemented using delay interferometers. This implementation is particularly interesting, since virtually all signal processing is done in the optical domain. High-speed electronics is employed only to perform CDR. Nevertheless, we restrict our focus to LO-based DQPSK, which can also be used in intra-data center links not employing inline optical amplification Frequency Offset Penalty Although the DQPSK receiver does not require CR, the frequency offset between transmitter and LO lasers may lead to a significant penalty. The error probability of M-DPSK as studied and is known.

Assuming that the SNR is time invariant the BER of M-DPSK in the presence of frequency error is given by $$P_b = \frac{2}{\log_2 M}(F(\pi) - F(\pi/M)), \qquad [11]$$

$$F(\phi) = \frac{\gamma_s \sin(\Delta\Psi - \phi)}{4\pi} \int_{-\pi/2}^{\pi/2} \frac{\exp(-(\gamma_s - \gamma_s \cos(\Delta\Psi - \phi)\cos t))}{\gamma_s - \gamma_s \cos(\Delta\Psi - \phi)\cos t} dt$$

where $\Delta\Psi = 2\pi f_{off} T_s$ is the phase error due to frequency offset $f_{off}$ during a symbol period.

Figure 11:
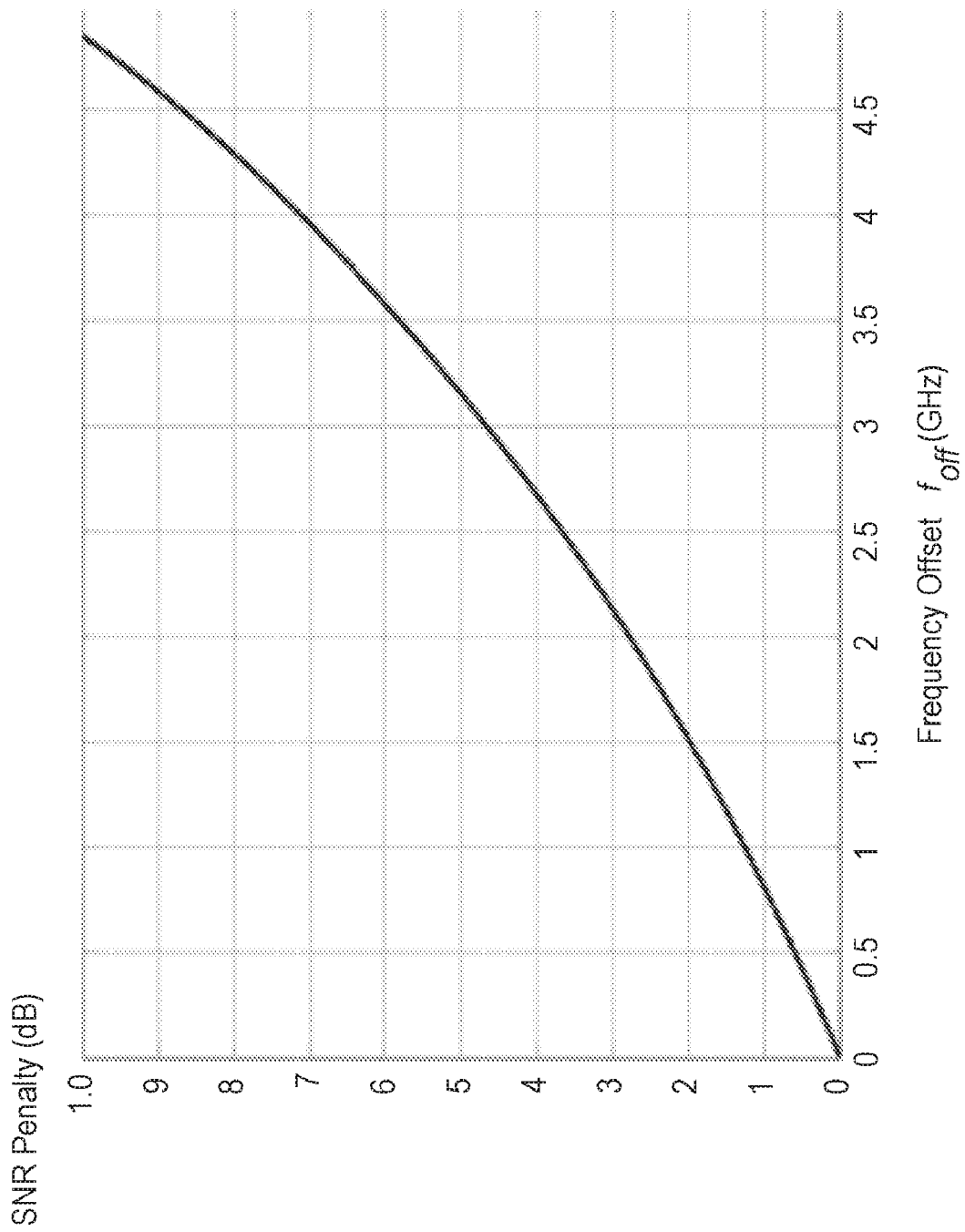
FIG. 11 is a plot showing SNR penalty as a function of frequency offset between transmitter and LO lasers according to aspects of the present disclosure.

FIG. 11 is a plot showing SNR penalty as a function of the frequency offset. The SNR penalty grows roughly quadratically with frequency offset and reaches 3 dB at $f_{off}$=2 GHz. As in the EPLL-based receivers discussed previously, frequency combs at both the transmitter and LO can be used to amortize the high cost and power consumption of strict laser temperature control. Alternatively, frequency-locking techniques based on frequency discriminators can be employed.

With this discussion in place, we may now compare the performance of receiver architecture(s) according to the present disclosure employing analog signal processing as compared with DSP-based counterparts. In a DSP-based receiver, equalization and polarization demultiplexing are simplified, as discussed in Appendix I. CR is performed using the Viterbi-Viterbi method, a feedforward method that uses a simple averaging filter rather than the optimal Wiener filter.

We target a bit rate of 200 Gbit/s per wavelength, resulting in 224 Gbit/s after including 7% FEC overhead, and 5% Ethernet overhead. The FEC is assumed to be RS(255, 239) or similar, which leads to a FEC threshold of $1.8 \times 10^{-4}$.

Figure 12:
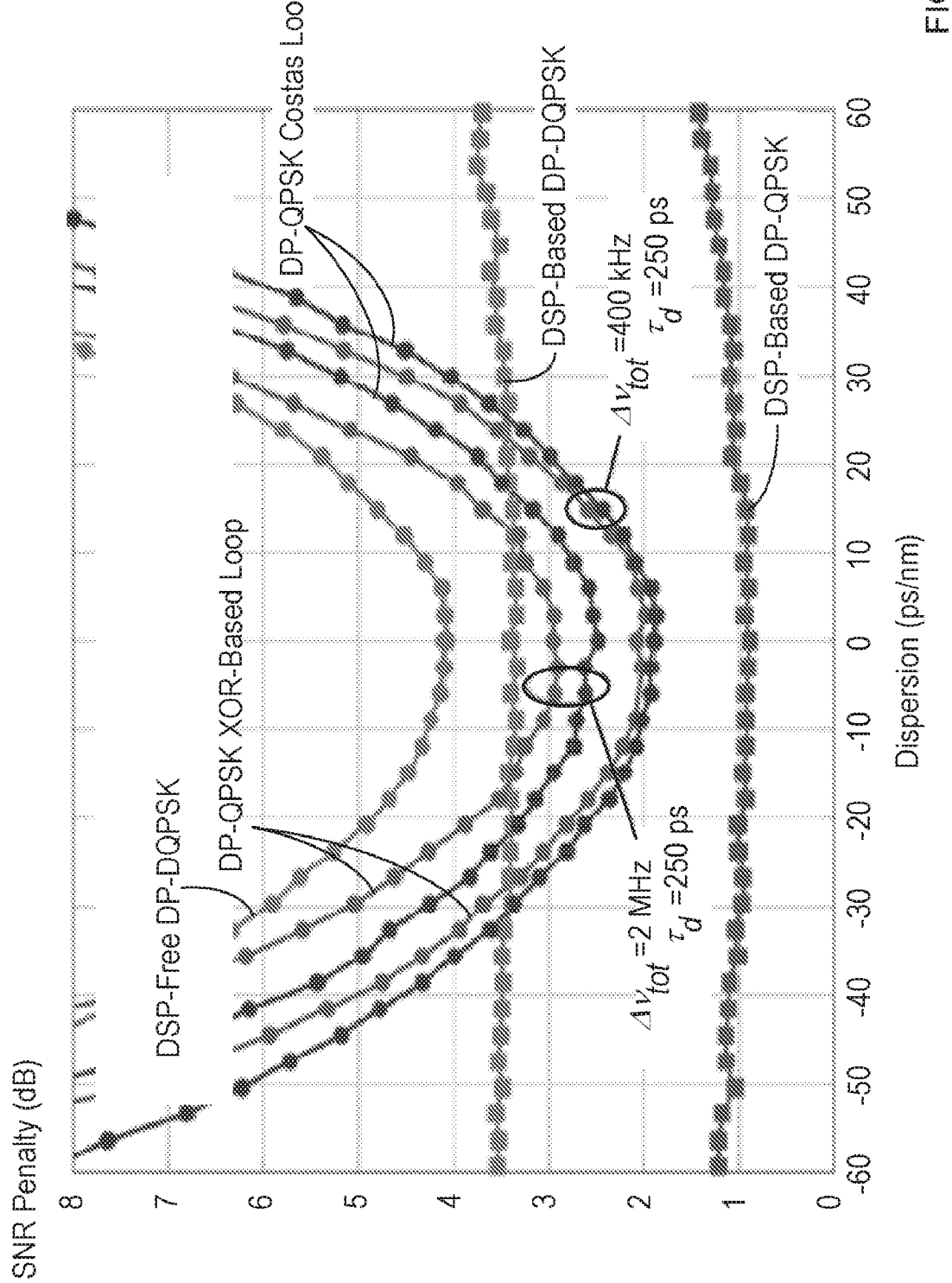
FIG. 12 is a plot showing power penalty vs. dispersion for several receiver architectures including those according to the present disclosure.

FIG. 12 is a plot showing SNR penalty vs CD for the several receiver architectures. Table 1 summarizes the simulation parameters. The reference SNR is roughly 11 dB, which corresponds to the SNR required to achieve the target BER with DP-QPSK in an ISI-free channel with matched filtering at the receiver.

At small CD, DSP-free systems exhibit ~1 dB SNR penalty compared to their DSP-based counterparts due to ISI from component bandwidth limitations and suboptimal receiver filtering, which in our simulation was a 5th-order Bessel filter with bandwidth equal to $0.7R_s$. Increasing CD incurs very little penalty in DSP-based systems owing to equalization. For DSP-free systems, the SNR penalty increases quadratically with CD and reaches 5 dB at roughly ±35 ps/nm. Note that, as expected, DQPSK systems exhibit a penalty of ~2.4 dB compared to QPSK systems.

The penalty of using an XOR-based loop as opposed to a Costas loop is less than 0.5 dB, even when $\Delta \upsilon_{tot}$=2 MHz. The two scenarios of $\Delta \upsilon_{tot}$=400 kHz and $\Delta \upsilon_{tot}$=2 MHz represent likely realizations of EPLL and OPLL, respectively.

An OPLL implementation requires phase tunable lasers, which typically exhibit linewidth on the order of a few MHz. An EPLL implementation can use standard DFB lasers, which exhibit linewidths of several hundred kHz.

An ideal, shot-noise limited DP-QPSK receiver exhibits receiver sensitivity of −35 dBm. Assuming realistic polarization demultiplexing loss of 2 dB, 90° hybrid loss of 1.5 dB, and 5 dB SNR penalty due to ±35 ps/nm dispersion, the receiver sensitivity becomes −26.5 dBm. Note that these values are for devices optimized for near 1550 nm; similar values are expected for devices optimized for near 1310 nm. This sensitivity would allow eye-safe systems near 1310 nm to achieve a reach up to 40 km. In fact, systems with 100 GHz wavelength spacing could support 49 channels with 5 dB of margin, and systems with 200 GHz wavelength spacing could support 25 channels with 8 dB of margin.

The SNR penalty in FIG. 12 is equivalent to an OSNR penalty in amplified systems. The actual values are related by the well-known expression:

$$OSNR = \frac{\Delta f}{\Delta \upsilon_{opt}} SNR \qquad [12]$$

where $\Delta \upsilon_{opt}$=12.5 GHz is the reference bandwidth to measure OSNR, and $\Delta f$ is the one-sided noise bandwidth of the electric signal before detection, which in the analog implementation, due to imperfect filtering, is $\Delta f \approx 38$ GHz. Hence, the reference system achieves the target BER when OSNR≈16 dB. Moreover, amplified systems near 1550 nm require optical CD compensation, as ±35 ps/nm of CD corresponds to just a few kilometers of dispersion-uncompensated transmission.

We restrict the power consumption comparison to the polarization demultiplexing and high-speed electronics for the DSP-free architectures, and ADCs and DSP for the DSP-based receiver. Other components such as the LO laser, photodiodes, TIA-AGCs, and FEC decoding are the same in both systems. Using the models listed in for power consumption of ADC and DSP of long-haul coherent systems, and the simplifications from Appendix I, the power consumption of the DSP-based receivers including only ADC and DSP for 224 Gbit/s DP-QPSK amounts to 37.3 W in 28 nm CMOS. In 7 nm CMOS, this estimate drops to 12.4 W. These calculations assume that a complex multiplication is performed using three real multiplications.

Power consumption of the analog receiver is harder to estimate, since there is more variability in the choice of transistor technology and the actual functional blocks implementation. The more complex operations performed in the proposed analog circuitry are analog mixers and XORs. Both can be realized using Gilbert cells. A 9-to-50-GHz Gilbert-Cell down-conversion mixer built in 130 nm CMOS had a total power consumption of 97 mW, while a 25-75 GHz broadband Gilbert-Cell mixer using 90-nm CMOS had a total power consumption of 93 mW. An EPLL implementation requires eight analog mixers and two XORs, which would result in nearly 1 W of power consumption. An OPLL-based DP-QPSK receiver and DP-DQPSK receiver have even lower power consumption, as they do not require a de-rotation stage.

Other receiver operations such as polarization demultiplexing and CDR are also power-efficient. For instance, three phase shifting sections can have a total power consumption of approximately 75 mW. Moreover, a 40 Gb/s CDR in 90 nm CMOS consumes 48 mW, excluding output buffers.

To summarize, we have described and evaluated DSP-free analog coherent receiver architectures for—by way of example—unamplified intra-data center links and amplified inter-data center links. We have shown that using a marker tone-based polarization demultiplexing scheme with an optical polarization controller, the analog coherent receiver can recover and track the transmitted polarization-multiplexed signals for a receiver operating at baseband. This technique can be extended to higher order QAM formats like 16-QAM and above, and can also be extended to higher-order IM formats such as 4-PAM and above. We have also shown how CR can be conducted using a multiplier-free phase detector based on XOR gates and that its performance is within 0.5 dB of a Costas loop-based phase detector. Finally, we have shown and described that DSP-free analog coherent receivers would have ~1 dB penalty at small CD relative to their DSP-based counterparts. The SNR-penalty for DSP-free systems increases quadratically with CD and reaches 5 dB at roughly ±35 ps/nm. The power consumption of polarization demultiplexing and high-speed electronics is estimated to be below 2 W in 40 nm CMOS. Moreover, the improved receiver sensitivity due to coherent detection would allow 40-km unamplified and eye-safe transmission of up to 49 DWDM channels near 1310 nm, potentially blending intra- and inter-data center applications.

Appendix I. Marker Tone Polarization Demultiplexing

To properly demultiplex the incoming, rotated polarizations, the polarization controller must essentially invert the fiber transfer matrix, so that $T_{Controller}T_{Fiber}=I$, where I is the identity matrix. Minimization of the marker tone in the tributaries in which it is not transmitted leads to solutions that satisfy one of two pairs of equations, namely:

$$\cos(\zeta)e^{j(\alpha_1+\alpha_0)}=\cos(\theta)e^{-j(\varphi_1+\varphi_0)}$$

$$\sin(\zeta)e^{-j(\alpha_1-\alpha_0)}=-\sin(\theta)e^{-j(\varphi_1-\varphi_0)}$$

$$\cos(\zeta)e^{j(\alpha_1+\alpha_0)}=-\cos(\theta)e^{-j(\varphi_1+\varphi_0)}$$

$$\sin(\zeta)e^{-j(\alpha_1-\alpha_0)}=\sin(\theta)e^{-j(\varphi_1-\varphi_0)} \quad [14]$$

The first pair of equations leads to solutions shown in the first three columns of Table 2. Each of these solutions properly inverts $T_{Fiber}$ and leads to polarization demultiplexing i.e., $T_{Controller}T_{Fiber}=I$.

The second pair of equations as shown in [14] leads to solutions shown in the second three columns of Table 2. In this case, the overall transfer matrix is $T_{Controller}T_{Fiber}=-I$, which corresponds to the constellation in each polarization being rotated by 180°. Therefore, minimizing the unwanted marker tone amplitude results in polarization demultiplexing with 180° phase ambiguity. Nevertheless—as discussed previously—this phase ambiguity is not critical since the receiver already has to resolve a 90° phase ambiguity introduced by CR.

Figure 13A:
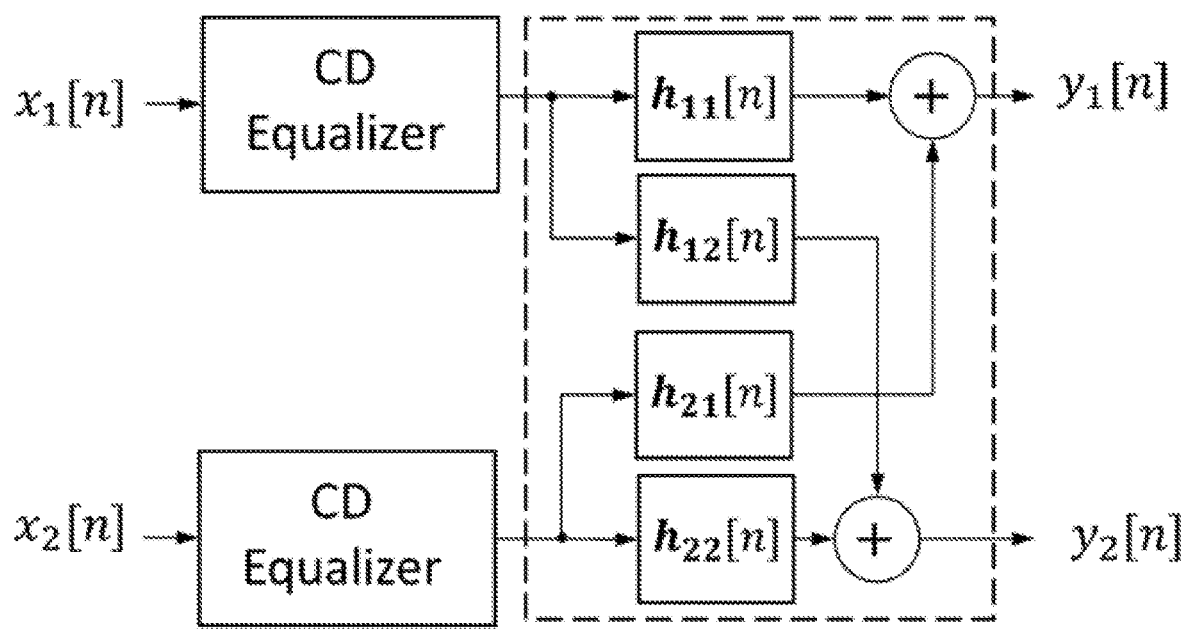
FIG. 13(A) and FIG. 13(B) show schematic block diagrams illustrating FIG. 13(A) CD and 2×2 MIMO equalizers used in conventional coherent receivers, and FIG. 13(B) simplified equalizers for short-reach applications assuming CD and small DGD approximation according to the present disclosure.

Changing any one of the three polarization controller variables by ±π also transforms the overall transfer matrix from −I to I. Changing any two of the three polarization controller variables ±π preserves the overall transfer matrix, allowing for resetting of phase shifters with finite excursion Appendix II. Simplified DSP-Based Coherent Receiver FIG. 13(A) shows a block diagram of equalization and polarization demultiplexing stages typically used in long-haul systems. First, CD equalization is performed using nearly static frequency-domain equalizers with hundreds of taps—followed by a 2×2 MIMO equalizer of filters (typically having less than 15 taps) that is frequently updated to mitigate PMD and track changes in the received state of polarization.

Note that the CD equalizers may be omitted if CD is small enough such that the filters in the 2×2 MIMO equalizer can sufficiently compensate for it. Moreover, note that if the skew between the two polarizations is much smaller than the sampling rate, the coefficients of filter $h_{11}$ are approximately proportional to those of $h_{12}$, and similarly for filters $h_{21}$ and $h_{22}$.

Figure 13B:
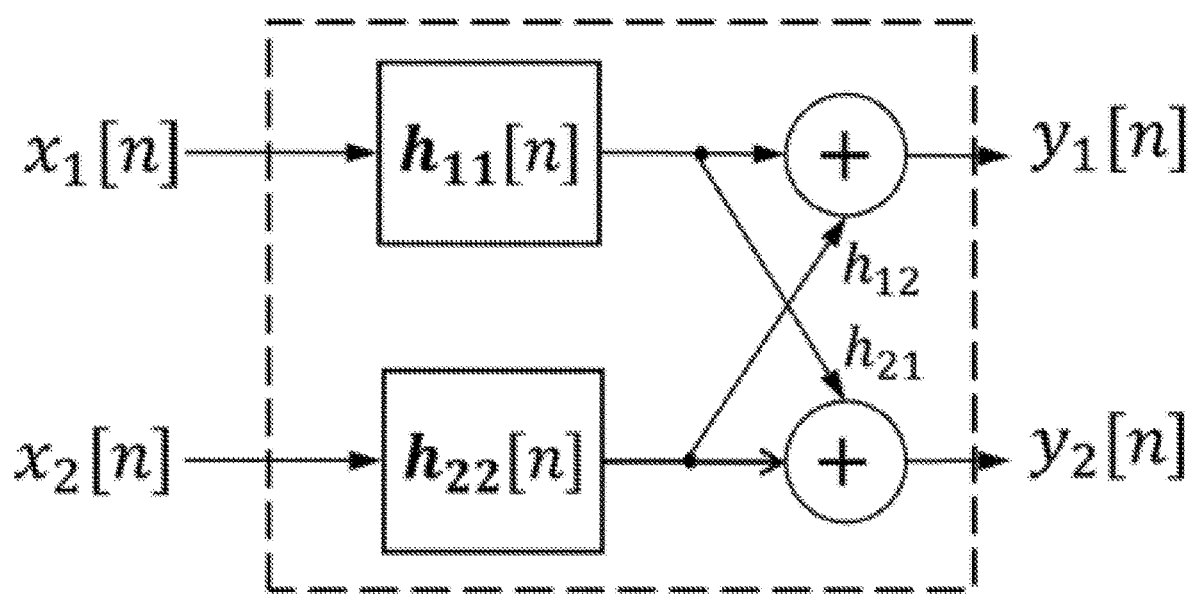

Accordingly, we can simplify the 2×2 MIMO as shown in FIG. 13(B), which nearly halves the required number of DSP operations as compared to the 2×2 MIMO equalizer of FIG. 13(A). Note further that this simplification only holds when the mean differential group delay (DGD) between the two polarizations is much smaller than the sampling rate, so that the two polarizations appear synchronized at the receiver. Assuming a sampling rate of 70 GS/s (oversampling ratio of 5/4), and PMD of 0.1 ps/√km, the small-DGD approximation holds up to ~200 km.

In FIG. 13(B), the filters $h_{11}$ and $h_{22}$ mitigate ISI caused by CD, PMD, and components bandwidth limitations. The cross terms $h_{12}$, $h_{21}$ remove the Y component from X and vice-versa. The filter coefficients can be updated using either least-mean squares (LMS) or constant-modulus amplitude (CMA) algorithms. The update equations are shown. Note that these equations assume a time-domain implementation. Since these filters are very short (7 taps in the simulations), there is virtually no difference in efficiency between time-domain and frequency-domain implementations. Note that for large CD systems, such as inter data center links reaching up to 80 km, the CD equalizers cannot be omitted.

TABLE 2

| $T_{Controller}T_{Fiber}=I$ | | | $T_{Controller}T_{Fiber}=-I$ | | |
| --- | --- | --- | --- | --- | --- |
| θ | $\varphi_0$ | $\varphi_1$ | θ | $\varphi_0$ | $\varphi_1$ |
| −ζ | −$\alpha_1$ | −$\alpha_0$ | −ζ | −$\alpha_1$ | −$\alpha_0+\pi$ |
| −ζ | −$\alpha_1+\pi$ | −$\alpha_0+\pi$ | −ζ | −$\alpha_1+\pi$ | −$\alpha_0$ |
| −ζ+π | −$\alpha_1$ | −$\alpha_0+\pi$ | −ζ+π | −$\alpha_1$ | −$\alpha_0$ |
| −ζ+π | −$\alpha_1+\pi$ | −$\alpha_0$ | −ζ+π | −$\alpha_1+\pi$ | −$\alpha_0+\pi$ |
| ζ | −$\alpha_1-\frac{\pi}{2}$ | −$\alpha_0+\frac{\pi}{2}$ | ζ | −$\alpha_1+\frac{\pi}{2}$ | −$\alpha_0+\frac{\pi}{2}$ |
| ζ | −$\alpha_1+\frac{\pi}{2}$ | −$\alpha_0-\frac{\pi}{2}$ | ζ | −$\alpha_1-\frac{\pi}{2}$ | −$\alpha_0-\frac{\pi}{2}$ |
| ζ+π | −$\alpha_1+\frac{\pi}{2}$ | −$\alpha_0+\frac{\pi}{2}$ | ζ+π | −$\alpha_1-\frac{\pi}{2}$ | −$\alpha_0+\frac{\pi}{2}$ |
| ζ+π | −$\alpha_1-\frac{\pi}{2}$ | −$\alpha_0-\frac{\pi}{2}$ | ζ+π | −$\alpha_1+\frac{\pi}{2}$ | −$\alpha_0-\frac{\pi}{2}$ |

TABLE 3

| Algorithm | Error-measure | Update equations |
| --- | --- | --- |
| CMA | $e_1[n]=2-\|y_1[n]\|^2$ | $h_{11} \leftarrow h_{11}+\mu e_1[n]y_1[n]x_1^*$ |
| | | $h_{12} \leftarrow h_{12}+\mu e_1[n]y_1[n]h_{11}^H x_1^*$ |
| LMS | $e_1[n]=y_1-[y_1]_D$ | $h_{11} \leftarrow h_{11}-2\mu e_1[n]x_1^*$ |
| | | $h_{12} \leftarrow h_{12}-2\mu e_1[n]h_{11}^H x_1^*$ |

At this point, those skilled in the art will readily appreciate that while the methods, techniques and structures according to the present disclosure have been described with respect to illustrative implementations and/or embodiments, those skilled in the art will recognize that the disclosure is not so limited. Accordingly, the scope of the disclosure should only be limited by the claims appended hereto.

The invention claimed is:

1. A DSP-free coherent receiver comprising a local oscillator, a dual-polarization hybrid arrangement, a detector arrangement, and a demodulator arrangement, said DSP-free coherent receiver CHARACTERIZED BY: (1) polarization recovery using cascaded phase shifters driven by a marker tone detection circuitry configured to provide a first control signal that includes a first marker tone, (2) phase locked loop carrier recovery selected from the group consisting of: an electrical phase locked loop and an optical phase locked loop, and (3) multiplier-free phase detection of a QPSK signal, which provides an output based on an estimate of a positive or negative sign of a phase error.

2. The DSP-free coherent receiver of claim 1 FURTHER CHARACTERIZED BY: no local oscillator frequency modulation.

3. The DSP-free coherent receiver of claim 1 FURTHER CHARACTERIZED BY: the multiplier-free phase detection based on XOR gates.

4. The DSP-free coherent receiver of claim 1 FURTHER CHARACTERIZED BY: the cascaded phase shifters include only 3 individual phase shifters.

5. The DSP-free coherent receiver of claim 1 FURTHER CHARACTERIZED BY: the cascaded phase shifters include only 2 individual phase shifters.

6. The DSP-free coherent receiver of claim 1 FURTHER CHARACTERIZED BY: a modulation format including dual-polarization quadrature phase shift keying (DP-QPSK).

7. The DSP-free coherent receiver of claim 4 wherein at least one phase shifter of the 3 individual phase shifters is adjustable to control an amplitude of the first marker tone in at least one detected signal.

8. The DSP-free coherent receiver of claim 5 wherein at least one phase shifter of the 2 individual phase shifters is adjustable to control an amplitude of the first marker tone in at least one detected signal.

9. A DSP-free coherent receiver comprising:
a local oscillator;
a dual-polarization hybrid arrangement;
a detector arrangement;
marker tone detection circuitry configured to provide a first control signal that includes a first marker tone;
a demodulator arrangement;
and wherein the DSP-free coherent receiver is CHARACTERIZED BY: a polarization controller that is operative for performing polarization recovery based on the first control signal; phase locked loop carrier recovery selected from the group consisting of: an electrical phase locked loop and an optical phase locked loop; and phase detection of a QPSK signal that is multiplier free, and that is configured to provide an output based on an estimate of a positive or negative sign of a phase error.

10. The DSP-free coherent receiver of claim 9 wherein the polarization controller includes a plurality of optical phase shifters that is arranged in a cascaded arrangement.

11. The DSP-free coherent receiver of claim 10 wherein at least one optical phase shifter of the plurality thereof is adjustable to control an amplitude of the first marker tone in at least one detected signal.

12. The DSP-free coherent receiver of claim 9 FURTHER CHARACTERIZED BY: no local oscillator frequency modulation.

13. The DSP-free coherent receiver of claim 9 wherein the multiplier-free phase detection is based on XOR gates.

14. The DSP-free coherent receiver of claim 9 FURTHER CHARACTERIZED BY: a modulation format including dual-polarization quadrature phase shift keying (DP-QPSK).

* * * * *